(12) United States Patent
Wolfe et al.

(10) Patent No.: US 7,112,846 B2
(45) Date of Patent: Sep. 26, 2006

(54) THIN FILM TRANSISTORS ON PLASTIC SUBSTRATES WITH REFLECTIVE COATINGS FOR RADIATION PROTECTION

(75) Inventors: Jesse D. Wolfe, Fairfield, CA (US); Steven D. Theiss, Woodbury, MN (US); Paul G. Carey, Mountain View, CA (US); Patrick M. Smith, San Ramon, CA (US); Paul Wickboldt, Walnut Creek, CA (US)

(73) Assignee: The Regents of the University of California, Oakland, CA (US)

( * ) Notice: Subject to any disclaimer, the term of this patent is extended or adjusted under 35 U.S.C. 154(b) by 120 days.

(21) Appl. No.: 10/621,875

(22) Filed: Jul. 16, 2003

(65) Prior Publication Data
US 2004/0016926 A1    Jan. 29, 2004

Related U.S. Application Data

(62) Division of application No. 09/705,484, filed on Nov. 3, 2000, now Pat. No. 6,642,085.

(51) Int. Cl.
*H01L 27/01* (2006.01)

(52) U.S. Cl. .................................. 257/347; 438/149
(58) Field of Classification Search ........ 257/347–354; 438/149, 166
See application file for complete search history.

(56) References Cited

U.S. PATENT DOCUMENTS

| 5,102,830 A | 4/1992 | Sandhu |
| 5,265,114 A | 11/1993 | Sun et al. |
| 5,326,426 A | 7/1994 | Tam et al. |
| 5,360,491 A | 11/1994 | Carey et al. |
| 5,360,752 A | 11/1994 | Brady et al. |
| 5,569,398 A | 10/1996 | Sun et al. |
| 5,807,771 A | 9/1998 | Vu et al. |
| 5,817,550 A | 10/1998 | Carey et al. |
| 5,918,140 A | 6/1999 | Wickboldt et al. |
| 6,019,796 A | 2/2000 | Mei et al. |
| 6,306,694 B1 * | 10/2001 | Yamazaki et al. .......... 438/151 |

FOREIGN PATENT DOCUMENTS

| EP | 0 453 169 A2 | 4/1991 |
| EP | 0 542 519 A1 | 11/1992 |
| EP | 0 575 965 A2 | 6/1993 |

OTHER PUBLICATIONS

Baumeister, P, "Use of hafnium dioxide in multilayer dielectric reflectors for the near uv," Applied Optics, vol. 16, No. 2, Feb. 1977, pp. 439-444.

* cited by examiner

*Primary Examiner*—Ori Nadav
(74) *Attorney, Agent, or Firm*—Eddie E. Scott; Alan H. Thompson

(57) ABSTRACT

Fabrication of silicon thin film transistors (TFT) on low-temperature plastic substrates using a reflective coating so that inexpensive plastic substrates may be used in place of standard glass, quartz, and silicon wafer-based substrates. The TFT can be used in large area low cost electronics, such as flat panel displays and portable electronics such as video cameras, personal digital assistants, and cell phones.

6 Claims, 5 Drawing Sheets

THIN FILM TRANSISTORS ON PLASTIC SUBSTRATES WITH REFLECTIVE COATINGS FOR RADIATION PROTECTION

CROSS-REFERENCE TO RELATED APPLICATIONS

This application is a division of application Ser. No. 09/705,484 filed Nov. 3, 2000 now U.S. Pat. No. 6,642,085 entitled, "Thin Film Transistors on Plastic Substrates with Reflective Coatings for Radiation Protection."

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to thin film transistors, and more particularly to the formation of silicon based thin film transistors on inexpensive, low-temperature plastic substrates. The present invention relates to a method of fabricating thin film transistors wherein heat sensitive substrates, such as inexpensive and flexible plastic substrates, may be used in place of standard glass, quartz, and silicon wafer-based substrates. A reflective coating for radiation protection of the plastic substrates is utilized during processing. The reflective coating layer is deposited above the plastic substrate to protect it from high intensity irradiation during processing by a laser or other high intensity radiation source.

Traditional techniques used in manufacturing high-performance polycrystalline silicon (poly-si) thin film transistors require processing temperatures of at least 600° C. This minimum temperature requirement is imposed by silicon crystallization and dopant activation anneals. Processes have recently been developed for crystallizing and doping amorphous silicon on a low cost, so-called low-temperature plastic substrates using a short pulsed high energy source in a selected environment, without heat propagation and build-up in the substrate so as to enable use of plastic substrates incapable of withstanding sustained processing temperatures higher than about 120° C. Such processes are described and claimed in U.S. Pat. No. 5,346,850 issued Sep. 13, 1994, to J. L. Kaschmitter et al. and U.S. Pat. No. 5,817,550 issued Oct. 6, 1998, to P. G. Carey et al., both assigned to the Assignee of the instant application.

As exemplified by the above-referenced U.S. Pat. No. 5,346,850, high performance polycrystalline silicon devices have been produced at low temperatures (<250° C.). This is accomplished by crystallizing the amorphous silicon layer (and activating dopants) with a short-pulse ultra-violet laser, such as an ArF excimer laser having a wavelength of 308 nm. The extremely short pulse duration (20–50 ns) allows the silicon thin film to melt and recrystallize without damaging the substrate or other layers in the device. Polycrystalline layers produced in this manner provide high carrier mobilities and enhanced dopant concentrations, resulting in better performance.

The present invention extends the capability of the above-mentioned method and processes for fabricating amorphous and polycrystalline channel silicon thin film transistors at temperatures sufficiently low to prevent damage to low cost, so-called low-temperature plastic substrates. The present invention utilizes a reflective coating for radiation protection of the plastic substrates during processing. A reflective coating layer is deposited above the plastic substrate to protect it from high intensity irradiation during processing by a laser or other high intensity radiation source. The process for fabrication of silicon thin film transistors on low-temperature plastic substrates, the thin film transistor, and the set of thin film transistor substrates for use in manufacturing thin film transistors of the present have different characteristics than existing thin film transistors. They have many and varied uses. For example, plastic displays and microelectronic circuits on flexible, rugged plastic substrates constructed in accordance with the present invention may be used for portable consumer electronics (video cameras, personal digital assistants, cell phones, etc.) or on large-area flat panel displays. Large area plastic displays are in need for high resolution large area flight simulators. Flexible detector arrays have use in radiation (X-ray, gamma-ray) detection. Silicon-on-insulator films may be used in radiation-hardened IC circuits. Many other uses exist and the development of the invention will produce additional uses.

SUMMARY OF THE INVENTION

The present invention relates to the fabrication of silicon-based thin film transistors (TFT), and more particularly, to a method of fabricating TFT wherein inexpensive and flexible plastic substrates are used in place of standard glass, quartz, and silicon wafer-based substrates. The present invention also relates to the fabrication of silicon-based TFT with plastic substrates utilizing a reflective coating for radiation protection of the plastic substrates during processing. A reflective coating layer is deposited above the plastic substrate to protect it from high intensity irradiation during processing by a laser or other high intensity radiation source.

The invention provides a method for the formation of TFT on inexpensive plastic substrates. The method of this invention utilizes sufficiently lower processing temperatures so that inexpensive flexible plastic substrates may be used. The so-called low-temperature plastic substrates have several advantages over conventionally used substrates such as glass, quartz, and silicon. Processing temperatures of the method of this invention are such that sustained temperatures are below a temperature of 120° C. although short duration high temperatures are used during the processing. This is accomplished using pulsed laser processing which produces the needed temperatures for short time periods while maintaining the sustained temperature of the substrate below a damage threshold (i.e. below about 120° C.). A reflective coating for radiation protection of the plastic substrates is utilized in the processing. A reflective coating layer is deposited above the plastic substrate to protect it from high intensity irradiation during processing by the laser or other high intensity radiation source. Thus, by the use of fabrication techniques of the present invention, the sustained temperature of the substrate is sufficiently low to prevent damage to the inexpensive and flexible low-temperature plastic substrates. The present invention provides a method which relies on techniques for depositing semiconductors, dielectrics, and metal at low temperatures, crystallizing and doping semiconductor layers in the TFT with a pulsed energy source.

The present invention significantly increases the type of plastic substrates that can be utilized in the fabrication of thin film transistors. In addition, plastic substrates have several advantages over conventional substrates, such as glass or silicon in that plastic can be much less expensive, lighter, more durable, rugged, and flexible. The process for fabrication of silicon thin film transistors on low-temperature plastic substrates, the thin film transistor, and the set of thin film transistor substrates for use in manufacturing thin film transistors of the present invention have different characteristics than existing thin film transistors. They have many and varied uses. For example, plastic displays and microelectronic circuits on flexible, rugged plastic substrates constructed in accordance with the present invention have multiple uses such as in field-deployable portable electronics, battlefield operations facilities, and the interior of ships, tanks and aircraft. Large area plastic displays are in need for high resolution large area flight simulators. Flexible detector arrays have use in radiation (X-ray, gamma-ray) detection. Silicon-on-insulator films may be used in radiation-hardened IC circuits. Many other uses exist and the development of the invention will produce additional uses.

It is an object of the present invention to enable fabrication of silicon-based thin film transistors on plastic substrates.

A further object of the invention is to provide a method for manufacturing thin film transistors wherein low cost, low-temperature substrates can be utilized.

Another object of the invention is to provide a method of fabricating thin film transistors wherein inexpensive plastic substrates may be used in place of standard glass, quartz, and silicon wafer-based substrates.

Another object of the invention is to provide a method for fabricating thin film transistors involving replacement of standard fabrication procedures with procedures utilizing sufficiently lower processing temperatures so that inexpensive plastic substrates may be used.

Another object of the invention is to enable the manufacture of thin film transistors using plastic substrates which enable use for large area low cost electronics, such as flat panel displays and portable electronics.

Another object of the invention is to protect transparent plastic substrates from damage due to exposure by radiation during processing through the use of a narrow-band reflective layer.

Other objects and advantages of the present invention will become apparent from the following description, accompanying drawings, and through practice of the invention.

BRIEF DESCRIPTION OF THE DRAWINGS

The accompanying drawings, which are incorporated into and form a part of the disclosure, illustrate embodiments of the invention, and, together with the description, serve to explain the principles of the invention.

DETAILED DESCRIPTION OF THE INVENTION

Figures 1A, 1B, 1C:
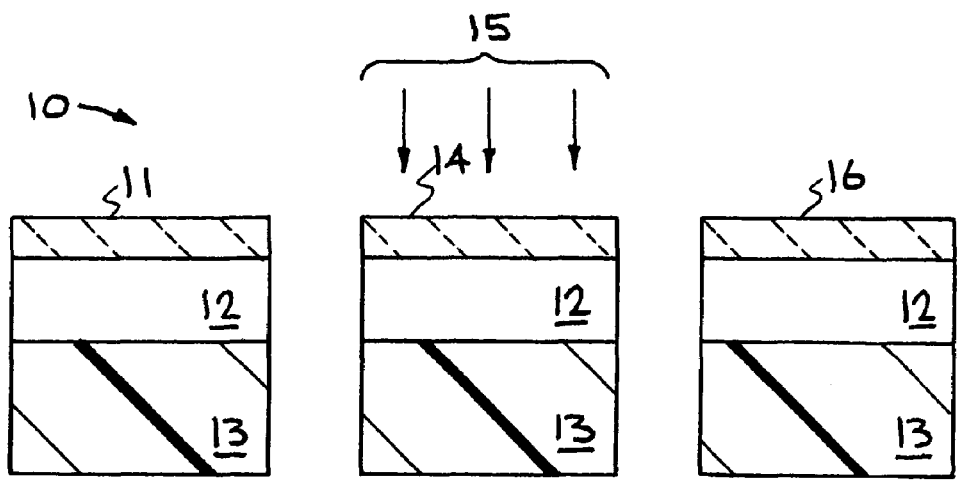
FIGS. 1A, 1B, and 1C illustrate pulsed laser melting of silicon on a plastic substrate to form poly-si.

The present invention involves (1) a method or process for fabrication of silicon thin film transistors on low-temperature plastic substrates, (2) a thin film transistor, (3) a set of thin film transistor substrates for use in manufacturing thin film transistors, and (4) the preparation of a reflective coating to protect the substrate and device from process radiation. The present invention utilizes techniques for depositing semiconductors, dielectrics, reflective coatings, and metals at low temperatures and crystallizing and doping semiconductor layers in the thin film transistors with a pulsed energy source, such as an excimer laser. The present invention enables the fabrication of amorphous and polycrystalline channel silicon thin film transistors at temperatures sufficiently low to prevent damage to plastic substrates. Low-temperature substrates are defined as those materials incapable of withstanding sustained processing temperatures higher than about 150°–250° C., compared to the so-called high-temperature materials such as silicon, glass, quartz, etc., which can withstand sustained processing temperatures of 400° C. and higher. While the low-temperature substrate may be heated higher than about 150°–250° C. for short time durations, such may be damaged if that time duration is longer than about $10^{-4}$ seconds (100 μs).

High intensity radiation is used to process materials in the manufacture of the thin film transistors (TFT). In many cases it is desirable to expose only specific materials or regions of the TFT to the radiation. This is often the case because other materials that are present, including the substrate, may be vulnerable to damage by the radiation. The TFT of the present invention is constructed by depositing a reflective coating in a layer above these vulnerable materials so that the radiation is reflected away and prevents such damage. High intensity radiation sources can be used on TFT that would otherwise be damaged by direct exposure to such radiation. It also enables greater flexibility in designing processes using materials that are vulnerable to damage by high intensity radiation.

Processes in which this procedure may be applied include using high intensity radiation for annealing, melting, crystallization, doping, ablation, photolithography, direct laser writing/patterning, etc. High intensity radiation sources include those with a short wavelength that will be readily absorbed by the substrate material (e.g. pulsed UV excimer lasers, frequency doubled NdYAG lasers, UV flashlamps, X-ray sources, etc.). Reflective coatings include single layer and multiple layers for narrowband or broadband reflection.

Methods or processes for fabrication of silicon TFT on low-temperature plastic substrates including techniques for depositing semiconductors, dielectrics, and metals at low temperatures and crystallizing and doping semiconductor layers in the thin film transistors with a pulsed energy source, such as an excimer laser. processes are described and claimed in U.S. Pat. No. 5,817,550 issued Oct. 6, 1998, to P. G. Carey et al., assigned to the Assignee of the instant application. The description, specification, and drawings of U.S. Pat. No. 5,817,550 are incorporated herein by reference.

A better understanding of the present invention can be obtained from the descriptions of the following specific (1) methods or processes for fabrication of silicon thin film transistors on low-temperature plastic substrates, (2) thin film transistors, and (3) sets of thin film transistor substrates for use in manufacturing thin film transistors. The descriptions provide a preferred embodiment of the invention.

The first embodiment provides pulsed laser crystallization or doping of a patterned silicon film on a transparent plastic substrate which has a multilayer narrowband reflective coating. The second embodiment provides pulsed laser doping of CMOS junctions whereby a reflective layer is deposited on top of the MOSFET gates, isolation oxides, and other regions to protect them from the laser pulse. This procedure will make possible the manufacture of: 1) Shallow junction formation for CMOS integrated circuits using silicon substrates or silicon-on-insulator; 2) Shallow junction formation for silicon (or germanium) microelectronics on plastic substrates; 3) Active matrix flat panel displays on plastic substrates; 4) High performance silicon (or germanium)-based electronic circuits on plastic substrates.

Two technical hurdles that have been overcome are (1) to manufacture and (2) to dope a poly-si film while preventing any thermal damage to the plastic substrate. Conventional processes to produce or dope poly-si require sustained temperatures at or above 600° C., a temperature range that will damage plastics. The present invention overcomes these hurdles by utilizing pulsed laser annealing to produce poly-si and using a reflective coating to prevent damage to the plastics.

Information that is helpful in an understanding of the present invention is provided with reference to FIGS. 1A, 1B, and 1C. These figures show a process of pulsed laser melting on a plastic substrate, generally designated by the reference numeral 10, to form poly-si. This illustrates manufacturing polycrystalline silicon (poly-si) based thin film transistors at low temperatures on plastic substrates.

The technique, illustrated in FIGS. 1A, 1B, and 1C involves using a high intensity ultraviolet excimer laser pulse that is absorbed at the surface of the silicon film 11. The pulse energy is sufficient to melt the silicon film 11. However, due to the short time scales involved, and the thermal barrier layer 12 below the silicon, the plastic substrate 13 experiences a small thermal load for only a brief time (tens of microseconds) which prevents any damage to the plastic substrate 13. In FIG. 1A the initial amorphous silicon film and thermal barrier on plastic substrate is shown. In FIG. 1B the melting of silicon layer by laser pulse 15 is shown. In FIG. 1C the resulting p-si 16 after solidification is shown.

One limitation of this process is that if the plastic substrate is directly exposed to the laser pulse it would be severely damaged. In the current implementation of this process the entire area of the substrate is covered by the silicon film, preventing any exposure to the laser.

Figures 2A, 2B, 2C:
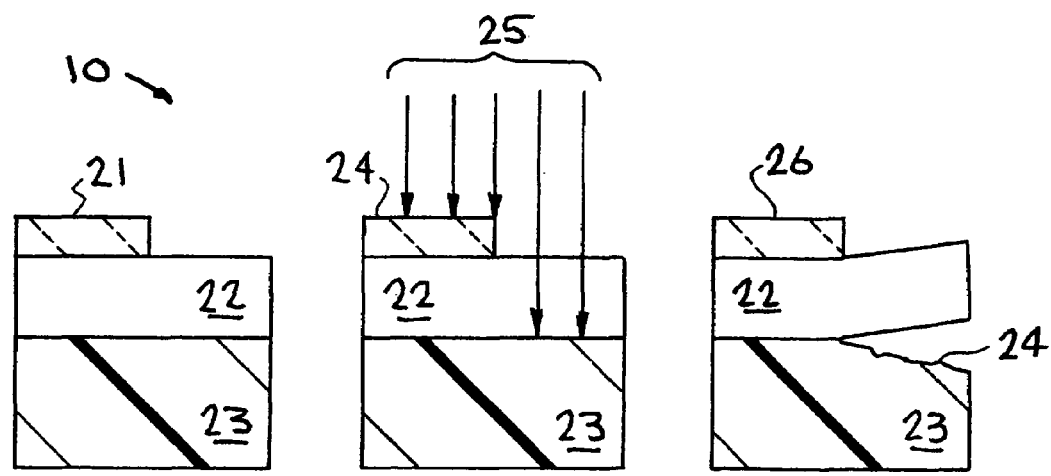
FIGS. 2A, 2B, and 2C provide an illustration of damage which can occur to a plastic substrate during pulsed laser melting of a patterned silicon film.

However, it is sometimes desirable to pattern the silicon film prior to laser exposure, which would lead to the situation illustrated in FIGS. 2A, 2B, and 2C. A high intensity ultraviolet excimer laser pulse 25 is absorbed at the surface of the silicon film 21. The pulse energy is sufficient to melt the silicon film 21. The thermal barrier layer 22 below the silicon 24 protects the plastic substrate 23 and prevents any damage to the plastic substrate 23 in that region.

As shown in FIGS. 2A, 2B, and 2C, when a pattern is used, the silicon 21/24 does not cover the entire area of the thermal barrier 22. The region of the thermal barrier/plastic substrate that is not covered by Si 21/24 is exposed to the laser pulse 25. As shown in FIG. 2B, the laser energy 25 is transmitted through the thermal barrier 22 layer and absorbed by the plastic substrate 23. Those regions of the plastic substrate 23 that are exposed to the laser energy 25 are readily damaged, and any films covering those regions may also be damaged or delaminated. The damaged area 24 is shown in FIG. 2C.

In the present invention, a highly reflective coating is deposited in a layer above the substrate to protect the plastic from the laser pulse. In a specific application where an optically transparent substrate is desirable, a narrow-band reflective coating which is designed to transmit in the visible, while being highly reflective at the wavelength of the laser, is deposited. Incorporating an appropriately engineered high reflectance layer allows for more flexibility in the procedures of laser processing.

Figure 3:
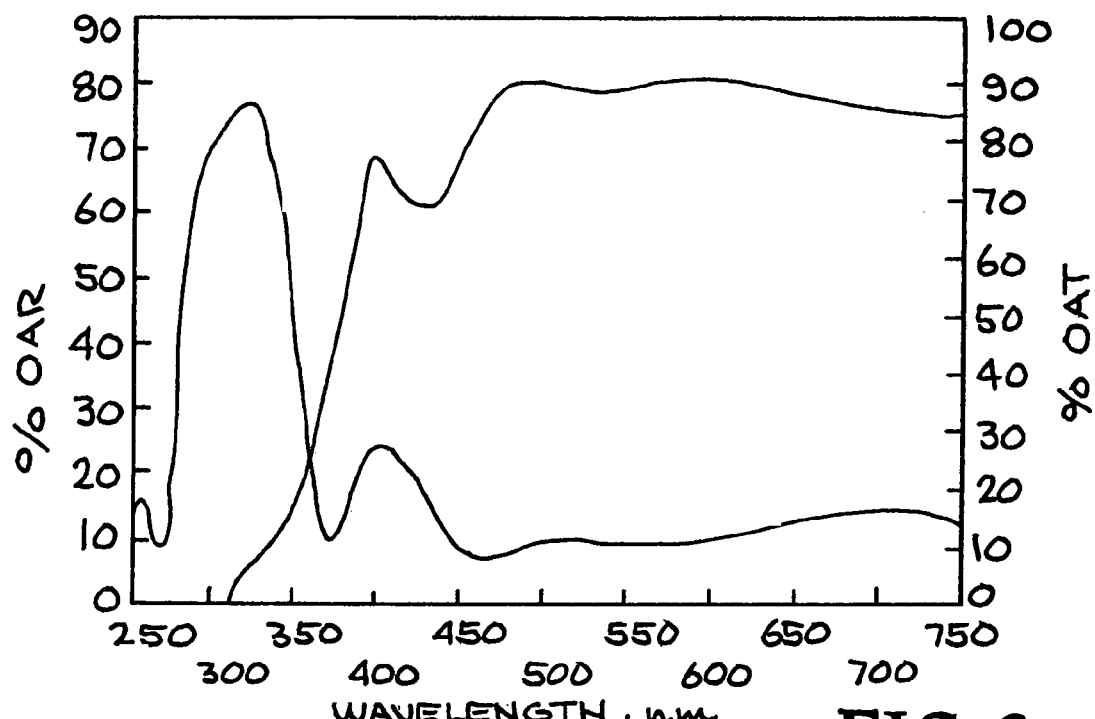
FIG. 3 shows the results of measuring reflectance of the coating.

A narrow band reflectance coating is deposited by sputtering on a polyester (PET) substrate. This is an actual multi-layer design. It was manufactured using the materials SiNx and $SiO_2$. The results of measuring reflectance of this coating are shown in FIG. 3. As displayed, the coating had a high reflectance in the UV, greater than 70% for wavelengths between 300 nm and 335 nm, while still being visibly transparent. This coated plastic was then exposed to Excimer laser pulses with a 308 nm wavelength. The plastic survived laser pulses with energy densities up to 350 millijoules $cm^{-2}$. An uncoated PET wafer was tested and could only survive energy densities up to 50 millijoules $cm^{-2}$. This clearly illustrates that a plastic wafer coated with such a reflective layer could be used in a process sequence where the substrate would be exposed to an intense laser pulse.

Figure 7:
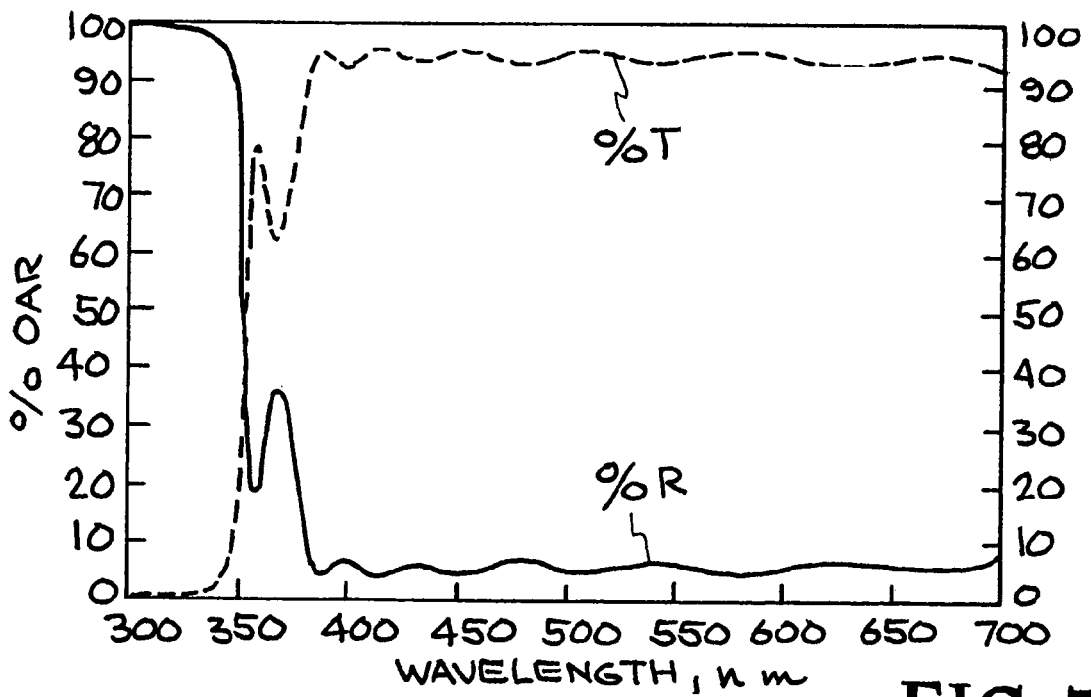
FIG. 7 shows the results of measuring reflectance of another coating used in the preferred embodiment of the present invention.

The results of measuring reflectance of another coating used in the preferred embodiment of the present invention are shown in FIG. 7. It can be produced using the materials HfOx and $SiO_2$. HfOx, has less absorption at the design wavelength (308 nm) than SiNx, and is also much easier to fabricate. This reflectance coating is deposited by sputtering on a polyester (PET) substrate. The graph, FIG. 7, shows the theoretical reflection and transmission curves of this layer design. The design will give greater than 99% reflection at 308 nm and >94% transmission of visible wavelengths, (400 nm–700 nm).

The present invention consists of the procedure and the physical product of depositing a reflective layer above a substrate and/or other material layers to protect them from high intensity irradiation during processing by a laser or other high intensity radiation source.

Referring again to the drawings and in particular to FIGS. 4A, 4B, 4C, 4D, and 4E configurations in which a reflective layer 32 can be used to protect an underlying substrate or layer 31 from high intensity radiation 35 during the processing of another layer are shown. The reflective layer 32 is configured such that the radiation used during processing would be reflected away from the substrate and/or any material layer 31 that is vulnerable to undesired damage by the radiation. This is illustrated in FIGS. 4A, 4B, 4C, 4D, and 4E for several layer configurations.

Figure 4A:
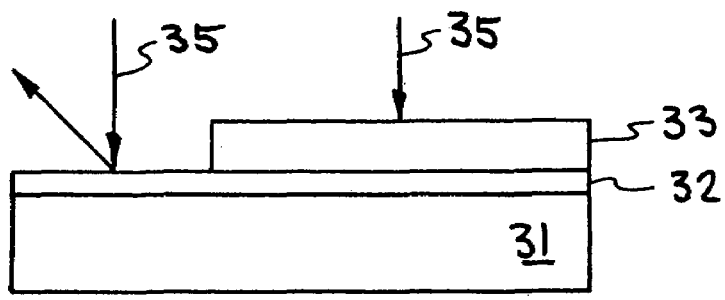
FIGS. 4A, 4B, 4C, 4D, and 4E show configurations in which a reflective layer can be used to protect an underlying substrate or layer from high intensity radiation during the processing of another layer.
Figure 4B:
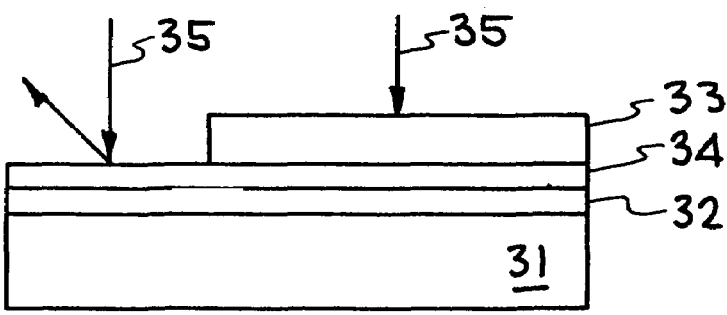
Figure 4C:
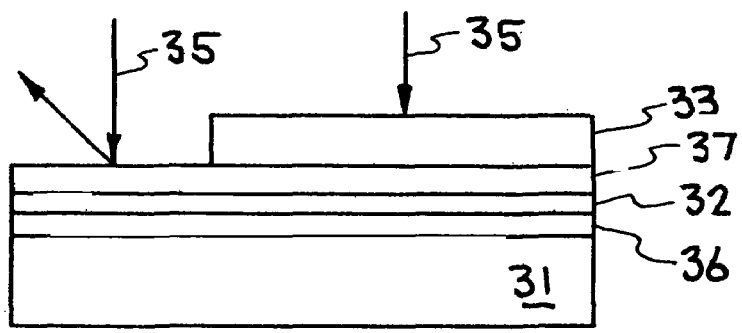

In FIG. 4A a reflective layer 32 is deposited directly on the substrate 31 and the material to be processed 33 is deposited directly on the reflective layer 32. FIG. 4B is similar to 4A except for the possibility of a transparent layer(s) located directly above the reflective layer 32. FIG. 4C illustrates the scenario in which the reflective layer 32 protects not only the substrate 31 but also any layer(s) above the substrate that could absorb the radiation and be damaged.

Figure 4D:
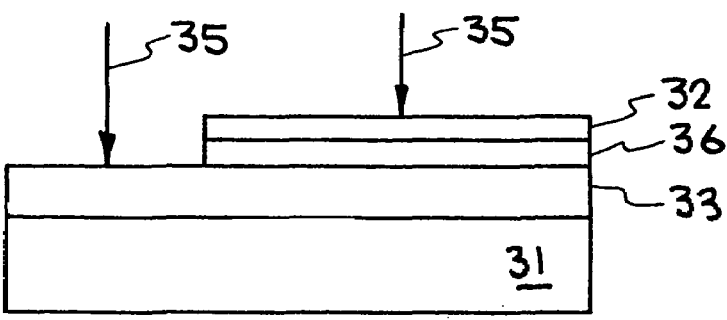
Figure 4E:
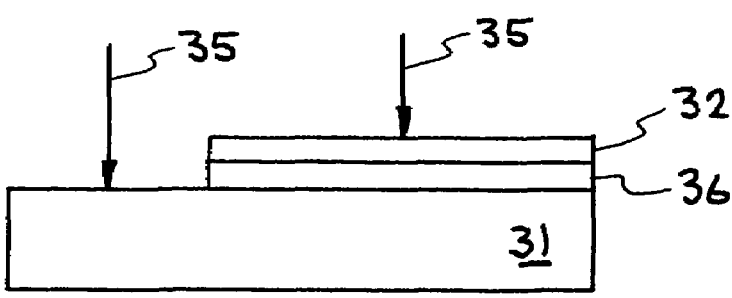

The reflective layer 32 could also be configured to protect materials that are located above the material to be processed 33. This is illustrated in FIG. 4D in which the layer(s) 36 that need to be protected are located above the layer to be processed 33, and the reflective layer 32 is patterned to allow irradiation of specific areas. FIG. 4E provides an example where the radiation is used to process exposed regions of the substrate 37, while the reflective layer 32 is patterned to protect layer(s) 36 that are above the substrate.

As illustrated, the reflective layer reflects the radiation that would otherwise cause undesired damage to the substrate or any other layer(s) on the substrate. This invention will enable processing using high intensity radiation sources on substrates that would otherwise be damaged by direct exposure to such radiation. Furthermore, the configurations in FIGS. 4D and 4E can be useful in laser processing of silicon substrate during IC fabrication.

Processes in which the present invention may be applied include using high intensity radiation for annealing, melting, crystallization, doping, ablation, photolithography and direct laser writing/patterning of either the substrate or any materials above it. High intensity radiation sources include those with a short wavelength that will be readily absorbed by the substrate material (e.g. pulsed UV excimer lasers, frequency doubled NdYAG lasers, UV flashlamps, X-ray sources, etc.). Reflective coatings include single layer and multiple layers for narrowband or broadband reflection. A narrowband reflective coating has the advantage that the coating can be transparent to visible wavelengths of light in situations where it is desirable to have a transparent substrate. The narrow band reflectance coating can be deposited by sputtering on a polyester (PET) substrate. This can be a multi-layer design using the materials SiNx and $SiO_2$. The coating has a high reflectance in the UV, greater than 70% for wavelengths between 300 nm and 335 nm, while still being visibly transparent. Another coating used in the preferred embodiment of the present invention can be produced using the materials HfOx and $SiO_2$. HfOx has less absorption at the design wavelength (308 nm) than SiNx and is also much easier to fabricate. This reflectance coating is deposited by sputtering on a polyester (PET) substrate. The design will give greater than 99% reflection at 308 nm and >94% transmission of visible wavelengths, (400 nm–700 nm).

The present invention is further illustrated by the example of processing a silicon thin film transistor (TFT) on a plastic substrate. Background can be obtained from a review of U.S. Pat. No. 5,817,550 issued Oct. 6, 1998, to P. G. Carey et al. and assigned to the Assignee of the instant application. The disclosure of U.S. Pat. No. 5,817,550 is incorporated herein by reference.

Figure 5A:
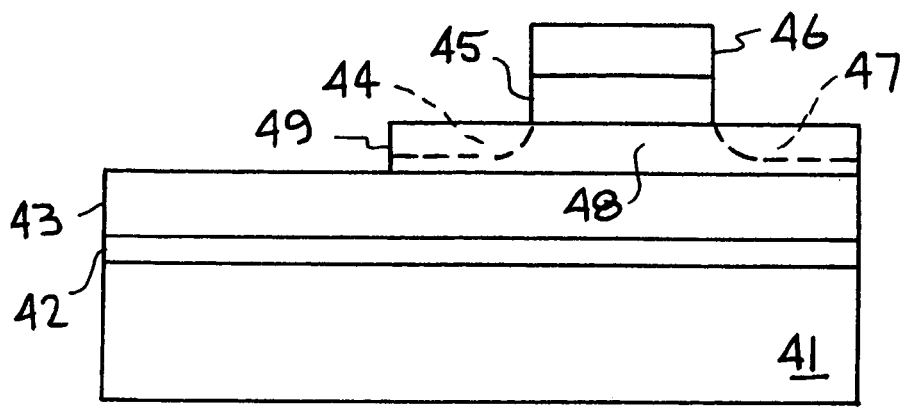
FIGS. 5A, 5B and 5C show a TFT structure that is produced using laser processing.

FIG. 5A shows one embodiment of the completed structure produced using the present invention. The device is made on plastic substrate 41. A transparent PET (polyethyleneterephthalate) substrate was used. This PET is readily damaged when exposed to an excimer laser pulse with energy densities used in laser processing of semiconductors. A reflective coating 42 is deposited directly on the substrate 41. For the process this layer could be a narrow-band reflective coating consisting of a multilayer that reflects ultraviolet radiation but is transparent in the visible. An optional thermal barrier may be deposited above or below the reflective layer 42. This barrier is currently either $SiO_x$ or $SiN_x$ and protects the plastic from the high intensity radiation used during laser processing of the silicon layer.

The TFT consists of a metal gate 46, a gate insulator 45, and a semiconductor layer which contains a source 44, drain 47 and channel 48 region. We currently use Aluminum as the metal and $SiO_2$ as the insulator. The semiconductor can be either silicon or germanium, and the source and drain regions are doped to achieve high conductivity and ohmic contact. This is a conventional top-gate TFT structure.

Figure 5B:
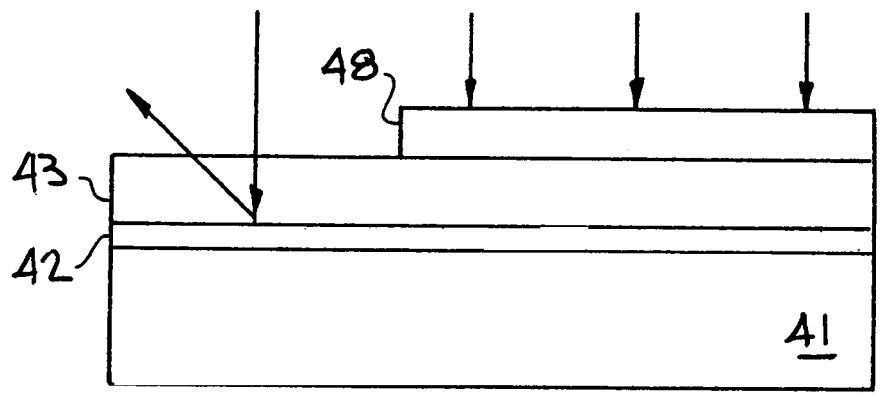
Figure 5C:
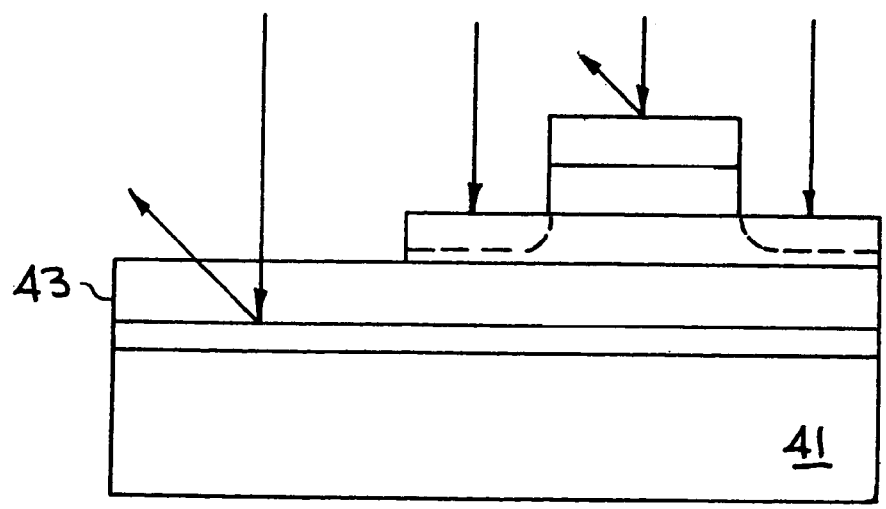

The present invention is best understood by considering the laser melting and laser doping steps used in producing the TFT. These two steps are illustrated in FIGS. 5B and 5C. During laser melting, excimer laser pulses (308 nm wavelength) are used to melt the semiconductor layer. As illustrated in FIG. 5B, in regions where there is no semiconductor, the laser pulse is reflected by the reflective layer. Without this reflection, the laser energy would be absorbed by the plastic substrate, resulting in damage. Without this reflective layer it has been necessary to leave the entire substrate area covered with the semiconductor film to protect the substrate. This reflective layer enables patterning the semiconductor before the laser processing, increasing the flexibility of arranging processing steps.

The plastic substrate is also protected by the reflective layer during laser doping (FIG. 5C). In this step, the laser pulse melts the source and drain regions of the semiconductor, while being reflected away from the channel region by the gate metal. While the semiconductor is molten, dopant molecules diffuse into the semiconductor. These dopant species are introduced either in the gas phase (traditional GILD processing) or in a thin film deposited on the surface just prior to the laser melt. Background information can be obtained from a review of U.S. Pat. No. 5,918,140 incorporated herein by reference. U.S. Pat. No. 5,918,140 was issued Jun. 16, 1997, to P. Wickboldt, P. G Carey, P. M. Smith, A. Ellingboe and T. W. Sigmon for deposition of dopant impurities and pulsed energy drive-in. A semiconductor doping process which enhances the dopant incorporation achievable using the Gas Immersion Laser Doping (GILD) technique. The enhanced doping is achieved by first depositing a thin layer of dopant atoms on a semiconductor surface followed by exposure to one or more pulses from either a laser or an ion-beam which melt a portion of the semiconductor to a desired depth, thus causing the dopant atoms to be incorporated into the molten region. After the molten region recrystallizes the dopant atoms are electrically active. The dopant atoms are deposited by plasma enhanced chemical vapor deposition (PECVD) or other known deposition techniques.

Again, in regions where there is no semiconductor, the reflective layer reflects the laser pulse and protects the plastic substrate. The thermal barrier included in FIGS. 5A–C need not be located above the reflective layer but could also be located below it. This could be beneficial in situations where this layer is not transparent to ultraviolet. In addition, if other materials are used that are vulnerable to damage by the laser pulse, they could be located below the reflective layer.

This current process is tailored for making TFTs for use on transparent PET for use in flat panel displays where a transparent plastic substrate is desired. This invention, however, could be used in the laser processing of devices for use in flexible circuitry and other applications where semiconductor devices are needed on substrates that can be damaged if exposed to the laser.

Figure 6:
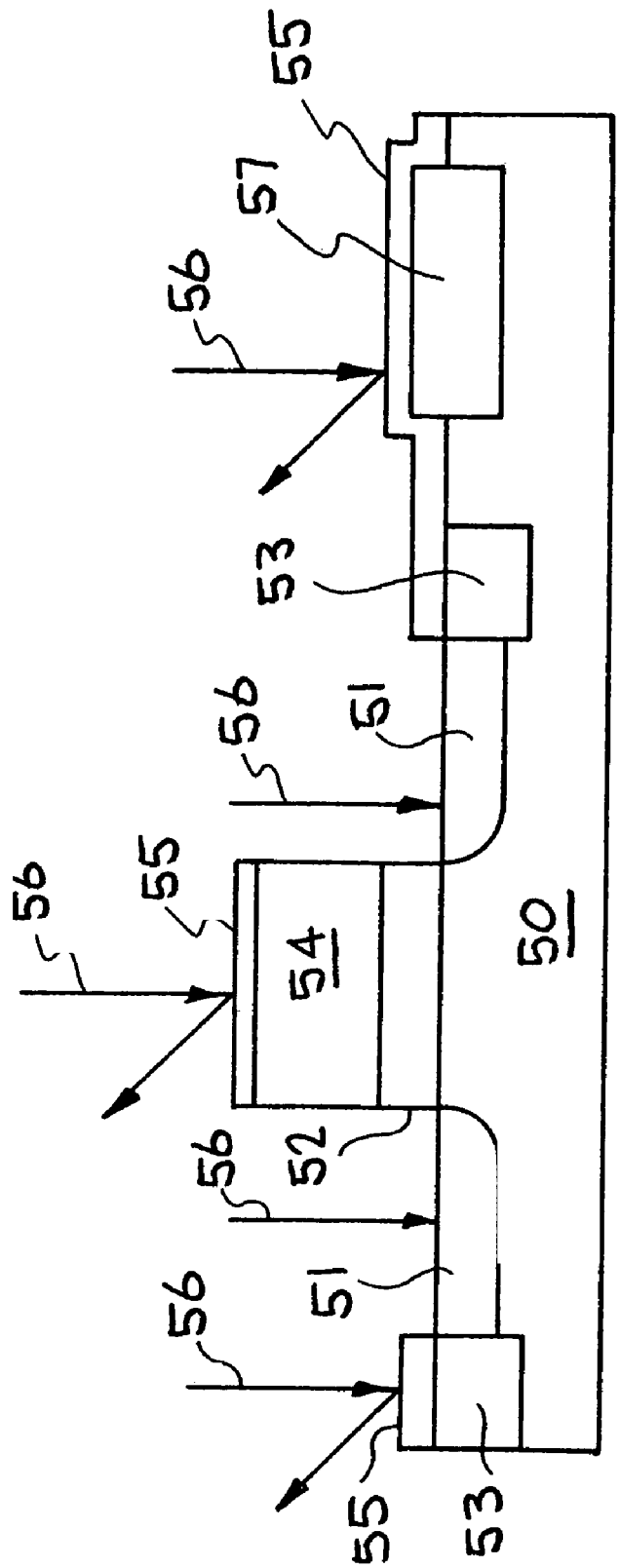
FIG. 6 shows shallow junction formation in a MOSFET by laser doping.

This invention can also be used in laser processing of CMOS devices. FIG. 6 illustrates the particular example of shallow junction doping of a MOSFET. The semiconductor junctions 51 are doped by laser melting using an excimer laser pulse 56. While the semiconductor is molten, dopant molecules diffuse into the semiconductor. These dopant species are introduced either in the gas phase (traditional GILD processing) or in a thin film deposited on the surface just prior to the laser melt (see U.S. Pat. No. 5,918,140 issued Jun. 16, 1997, to P. Wickboldt, P. G Carey, P. M. Smith, A. Ellingboe, and T. W. Sigmon for deposition of dopant impurities and pulsed energy drive-in). Prior to the laser exposure, reflective layer 55 is deposited over the device structure and patterned. The reflective layer is patterned to cover and protect the gate region 52 and 54, the isolation oxide region 53, and any other regions across the substrate which may contain materials vulnerable to laser damage 57. Correspondingly, the reflective layer is patterned to expose those regions the silicon substrate 50 that are doped to make the junctions 51.

This application can be used to protect poly-silicon or silicide gates 54 which will absorb the laser radiation, resulting in undesired damage. In addition, the "field regions" 53 are conventionally made with thermally grown oxide on a silicon substrate and could be damaged by laser melting.

This example illustrates use of the invention in MOSFET fabrication. However, a similar approach can be adopted to make use of this invention in laser processing of a variety of IC devices.

The process for fabrication of silicon thin film transistors on low-temperature plastic substrates, the thin film transistor, and the set of thin film transistor substrates for use in manufacturing thin film transistors of the present invention have many and varied uses. The process for fabrication of silicon thin film transistors on low-temperature plastic substrates, the thin film transistor, and the set of thin film transistor substrates for use in manufacturing thin film transistors of the present have different characteristics than existing thin film transistors. There will be many and varied uses of the new thin film transistors. For example, plastic displays and microelectronic circuits on flexible, rugged plastic substrates constructed in accordance with the present invention have multiple uses such as in field-deployable portable electronics, battlefield operations facilities, and the interior of ships, tanks and aircraft. Large area plastic displays are in need for high resolution large area flight simulators. Flexible detector arrays have use in radiation (X-ray, gamma-ray) detection. Silicon-on-insulator films may be used in radiation-hardened IC circuits. Other uses, too numerous to describe here, also exist. While particular embodiments, operational sequences for fabrication, materials, parameters, etc., have been set forth to exemplify and explain the principles of the invention, such are not intended to be limiting. Modifications and changes may become apparent to those skilled in the art, and it is intended that the invention be limited only by the scope of the appended claims.

The invention claimed is:

1. A semiconductor device, consisting of a plastic substrate, a layer that can be damaged by pulsed radiation, a narrowband reflective coating layer, a transparent layer, and a layer fabricated with pulsed radiation, with said semiconductor device consisting of the structural elements located in the following order:

a plastic substrate, a layer that can be damaged by said pulsed radiation, said layer that can be damaged by said pulsed radiation positioned above said plastic substrate and operatively connected to said layer fabricated with pulsed radiation, a narrowband reflective coating layer, said narrowband reflective coating layer positioned above said layer that can be damaged by pulsed radiation, positioned above said plastic substrate, and operatively connected to said layer that can be damaged by said pulsed radiation, a transparent layer, said transparent layer located directly above said narrowband reflective coating layer, and a layer fabricated with pulsed radiation, said layer fabricated with pulsed radiation positioned above said plastic substrate, wherein said narrowband reflective coating layer is positioned over said layer that can be damaged by said pulsed radiation for reflecting said pulsed radiation and protecting said layer that can be damaged by said pulsed radiation.

2. The semiconductor device of claim 1 wherein said layer that can be damaged by said pulsed radiation is low temperature plastic.

3. The semiconductor device of claim 1 wherein said narrowband reflective coating layer is single layer.

4. The semiconductor device of claim 1 wherein said narrowband reflective coating layer is a single layer of narrow band reflectance coating.

5. The semiconductor device of claim 1 wherein said layer that can be damaged by said pulsed radiation is low temperature plastic, said narrowband reflective coating layer is single layer of narrowband reflective coating, and said layer fabricated with pulsed radiation is a layer that has been fabricated with high intensity radiation sources.

6. The semiconductor device of claim 1 wherein said layer that can be damaged by said pulsed radiation is polyester.

* * * * *